United States Patent
Haddad et al.

(10) Patent No.: US 6,240,016 B1
(45) Date of Patent: May 29, 2001

(54) METHOD TO REDUCE READ GATE DISTURB FOR FLASH EEPROM APPLICATION

(75) Inventors: Sameer S. Haddad, San Jose; Lee Cleveland, Santa Clara, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/495,214

(22) Filed: Jan. 31, 2000

Related U.S. Application Data

(60) Provisional application No. 60/172,325, filed on Dec. 17, 1999.

(51) Int. Cl.$^7$ ................................................. G11C 16/04
(52) U.S. Cl. ............................... 365/185.18; 365/185.17
(58) Field of Search .................. 365/185.18, 185.17, 365/185.01

(56) References Cited

U.S. PATENT DOCUMENTS

| | | | |
|---|---|---|---|
| Re. 36,210 | * | 5/1999 | Santin .............................. 365/185.19 |
| 5,416,738 | * | 5/1995 | Shrivastava ...................... 365/185.24 |
| 5,438,542 | * | 8/1995 | Atsumi et al. ........................ 365/182 |
| 5,894,438 | * | 4/1999 | Yang et al. ..................... 365/185.18 |
| 5,896,314 | * | 4/1999 | Chen ................................ 365/185.01 |

* cited by examiner

Primary Examiner—David Nelms
Assistant Examiner—Hoai V. Ho
(74) Attorney, Agent, or Firm—H. Donald Nelson

(57) ABSTRACT

A method of reading a flash memory (EEPROM) device by applying zero volts to all bitlines and substrate terminal in the flash memory device, a positive voltage of between 4 to 5 volts is applied to the wordline to which the cell being read is attached and a voltage of less than equal to 2 volts is applied to the common source terminal.

3 Claims, 3 Drawing Sheets

METHOD TO REDUCE READ GATE DISTURB FOR FLASH EEPROM APPLICATION

This application claims benefit of provisional application 60/172,325 filed Dec. 17, 1999.

BACKGROUND OF THE INVENTION

1. Field of the Invention

This invention relates generally to the art of microelectronic integrated circuits. More specifically, this invention relates to flash Electrically Erasable Programmable Read Only Memory (EEPROM) devices. Even more specifically, this invention relates to a method to read flash Electrically Erasable Programmable Read Only Memory (EEPROM) devices that reduces the stress in the tunnel oxide in the source region.

2. Discussion of the Related Art

A microelectronic Electrically Erasable Programmable Read-Only Memory (Flash EEPROM) device includes an array of cells that can be independently programmed and read. The size of each cell and thereby the memory device are made small by omitting select transistors that would enable the cells to be erased independently. As a result all of the cells must be erased simultaneously as a block.

A memory of this type includes individual Metal-Oxide-Semiconductor (MOS) field effect transistor memory cells, each of which includes a source, drain, floating gate and control gate to which various voltages are applied to program the cell with a binary "1" or "0" or to erase all of the cells as a block.

The cells are connected in a rectangular array of rows and columns, with the control gates of the cells in a row being connected to a respective wordline and the drains of the cells in a column being connected to a respective bitline. The sources of the cells are connected together to a common source. This arrangement is known as a NOR memory configuration.

A cell is programmed by applying typically 8–9 volts to the control gate, approximately 5 volts to the drain and grounding the source, which causes hot electrons to be injected from the drain depletion region into the floating gate. Upon removal of the programming voltages, the injected electrons are trapped in the floating gate and create a negative charge therein that increases the threshold voltage of the cell to a value in excess of approximately 4 volts.

A cell can be erased in several ways. In one arrangement, applying typically 12 volts to the source, grounding the control gate and allowing the drain to float erases a cell. This causes the electrons that were injected into the floating gate during programming to be removed by Fowler-Nordheim tunneling from the floating gate through the thin tunnel oxide layer to the source. Alternatively, applying a negative voltage on the order of minus 10 volts to the control gate, applying 5 volts to the source and allowing the drain to float can erase a cell.

The cell is read by applying typically 4 to 5 volts to the control gate, approximately 1 volt or less to the bitline to which the drain is connected, grounding the source, and sensing the bitline current. If the cell is programmed and the threshold voltage is relatively high (≈4 volts), the bitline current will be zero or at least relatively low. If the cell is not programmed or erased, the threshold voltage will be relatively low (≈2 volts), the control gate voltage will enhance the channel, and the bitline current will be relatively high.

To have high enough read current, the voltage at the gate is required to be 4 to 5 volts. Because the source is grounded (0 volts), this relatively large potential difference across the tunnel oxide in the vicinity of the source region. The relatively large potential difference causes a stress field across the tunnel oxide in the vicinity of the source region during the duration of the read pulse. This field is applied across all the bits on the selected wordline. Due to oxide integrity weakness from bit-to-bit, some bits will gain charge and disturb the state of the bits. Blank "1" cells could be programmed and turn to a "0" causing a failure of the flash device after many read cycles. The field across the tunnel oxide is highest close to the source junction. The tunnel "thin" oxide at the source side experiences most of the degradation during cycling, becoming weak allowing conduction through it at lower applied electric fields.

Because the source junction is more graded than the drain junction and optimized for erase, higher voltages across the source could be used without enhancing read disturb due to hot-carrier injection. Reading the cell at the source side reduces the field across the weakest or stressed region of the tunnel oxide during read. For example, if the cell is read with 2 volts applied to the source, the stress across the tunnel oxide will be significantly reduced relative to the conventional approximately 1.7 Megavolts per centimeter. This reduction in the oxide field will result in extending the time-to-failures of flash devices by better than an order of magnitude. This method will work the best for applications with reduced source capacitance, for example, a device with a local interconnect. In addition, the time required to pump the source voltage during page read becomes insignificant for the devices having high $V_{ss}$ capacitance.

Therefore, what is needed is a method of reading a cell that reduces the stress across the tunnel oxide at the source region.

SUMMARY OF THE INVENTION

According to the present invention, the foregoing and other objects and advantages are achieved by a method of reading a flash Electrically-Erasable Programmable Read Only Memory (EEPROM) that reduces the electric field in the source side tunnel oxide region.

In accordance with an aspect of the present invention, zero volts is applied to all bitlines, a positive voltage is applied to the wordline to which the cell being read is attached and a positive voltage is applied to the common source terminal.

In accordance with another aspect of the present invention, the remaining wordlines are grounded and the substrate terminal is grounded.

In accordance with another aspect of the present invention, the voltage applied to the wordline to which the cell being read is a voltage of approximately 4 to 5 volts.

In accordance with still another aspect of the present invention, the voltage applied to the common source terminal is a voltage of less than or equal to 2 volts.

The described method thus provides a method of reading a flash memory device that reduces the electric field in the source side tunnel oxide region of a flash memory device.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention that illustrates the best mode presently contemplated by the inventors for practicing the invention.

Figure 1:
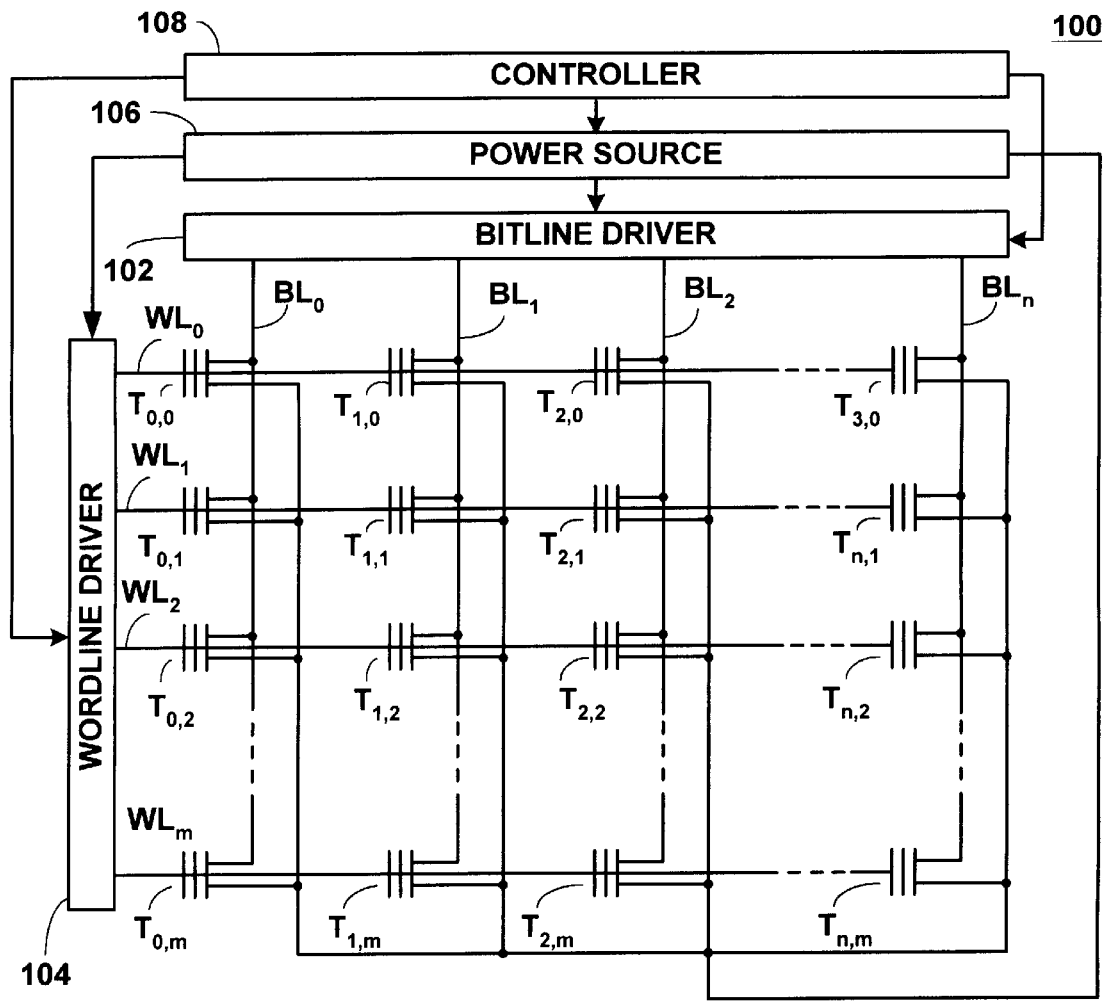
FIG. 1 is a simplified electrical schematic diagram of a flash EEPROM device showing an array of memory cells and control elements.

FIG. 1 illustrates the basic configuration of a NOR type flash Electrically Erasable Programmable Read-Only Memory (EEPROM) device 100 to which the present invention is advantageously applied. The memory device 100 is made up by a plurality of core or memory cells that are arranged in a square or rectangular matrix or array of rows and columns. Each row is associated with a wordline, whereas each column is associated with a bitline. The sources of all of the memory cells are connected to a common terminal, $V_s$.

Assuming that there are n columns and m rows, the bitlines are designated $BL_o$ to $BL_n$ and the wordlines are designated as $WL_o$ to $WL_m$. A bitline driver 102 applies appropriate voltages to the bitlines, whereas a wordline driver 104 applies appropriate voltages to the wordlines. The voltages applied to the drivers 102 and 104 are generated by a power source or supply 106 under the control of a controller 108 that is typically on-chip logic circuitry. The controller 108 also controls the drivers 102 and 104 to address memory cells individually or collectively as will be described below.

A memory cell is located at each junction of a wordline and a bitline. Each cell includes a Metal-Oxide-Semiconductor (MOS) Field-Effect-Transistor (FET) having a source, a drain, a layer of gate oxide and a control gate. The cells of a flash EEPROM differ from conventional FETs in that they additionally include a floating gate and tunnel oxide layer formed underneath the control gate.

The cells illustrated in FIG. 1 are designated using the notation $T_{n,m}$, where m is the row (wordline) number and n is the column (bitline) number. The control gates of the cells are connected to respective wordlines and the drains of the cells are connected to respective bitlines as illustrated. The sources of all of the cells are connected to the common terminal $V_s$, which is connected to the power supply 106. The connection to the power supply 106 is not shown.

A typical prior art method of reading the cell is by applying typically 4 to 5 volts to the control gate of the cell, applying about 1 volt to the bitline to which the drain of the cell is connected, grounding the source of the cell, and sensing the bitline current. If the cell is programmed and the threshold voltage is relatively high ($\approx$4 volts), the bitline current will be zero or at least relatively low. If the cell is not programmed or erased, the threshold voltage will be relatively low ($\approx$2 volts), the control gate voltage will enhance the channel, and the bitline current will be relatively high. Reading is preferably performed using sense amplifiers and a reference current array, the details of which are not a particular subject matter of the present invention.

Figure 2:
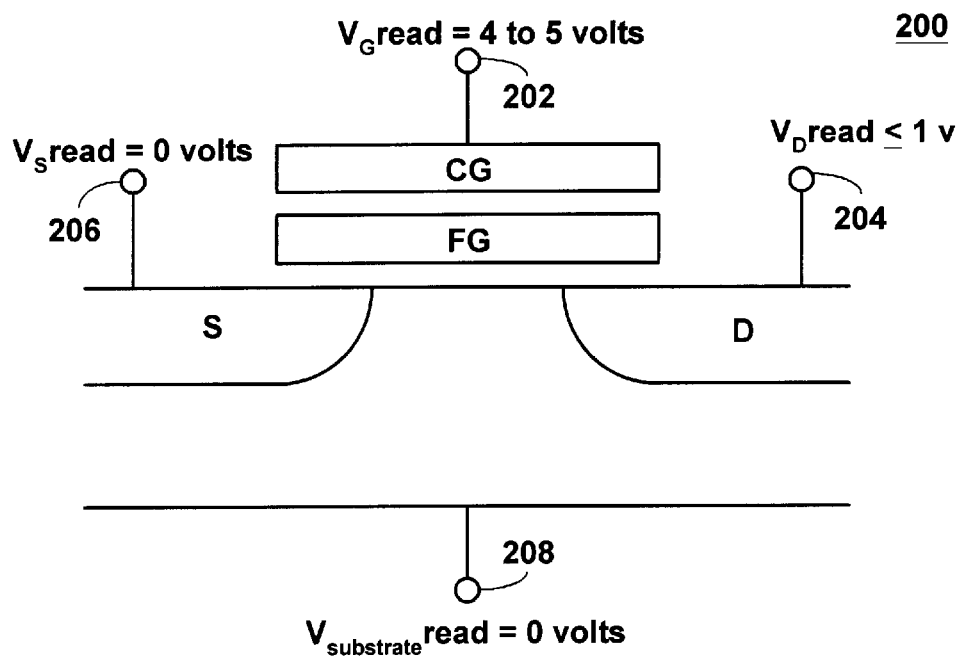
FIG. 2 shows a single flash memory cell with read voltages applied to the terminals of the flash memory cell in accordance with the prior art.

FIG. 2 shows a single flash memory cell 200 with read voltages applied to the terminals of the flash memory cell 200 during a read operation in accordance with the prior art. During read, a read voltage of from about 4 to 5 volts is applied to the terminal 202 via the wordline attached to the gate of the cell being read. A read voltage of about 1 volt is applied to the terminal 204 via the bitline attached to the drain of the cell being read. The source terminal 206 is connected to ground (0 volts) via a line that is electrically connected to a common terminal. As is known in the flash memory art, all of the sources are connected to a common terminal. Zero voltage is applied to the terminal 208 that is electrically connected to the substrate, which is also common to all the cells in the device. During read the transistor is in saturation and line 210 shows the inversion region and shows the strength of the electric field at the source end of the tunnel oxide. As can be appreciated, a voltage differential of from 4 to 5 volts is applied between the gate terminal and source terminal of all of the bits attached to the wordline of the cell being read.

Figure 3:
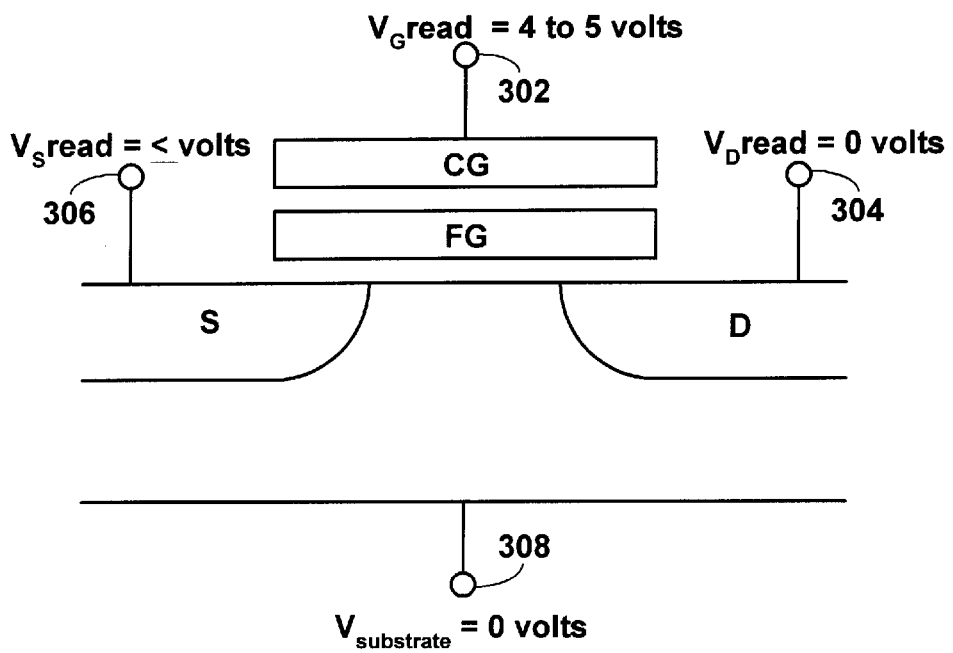
FIG. 3 shows a single flash memory cell with read voltages applied to the terminals of the flash memory cell in accordance with the present invention.

FIG. 3 shows a single flash memory cell 300 with read voltages applied to the terminals of the flash memory cell 300 during a read operation in accordance with the present invention. During read, a gate read voltage of about 4 to 5 volts is applied to the terminal 202 via the wordline attached to the gate of the cell being read, a zero voltage is applied to the bitline to which the cell being read is attached via the terminal 304 and a voltage of a about 2 volts is applied to the source via a line that is electrically attached to a common terminal. During read, the substrate is connected to ground via terminal 308. This allows the cell to be read from the source side and reduces the electric field. Because the source junction is a graded junction, the doping is less and therefore does not generate hot carriers and reduces the stress in the tunnel oxide in the source region.

Figure 4:
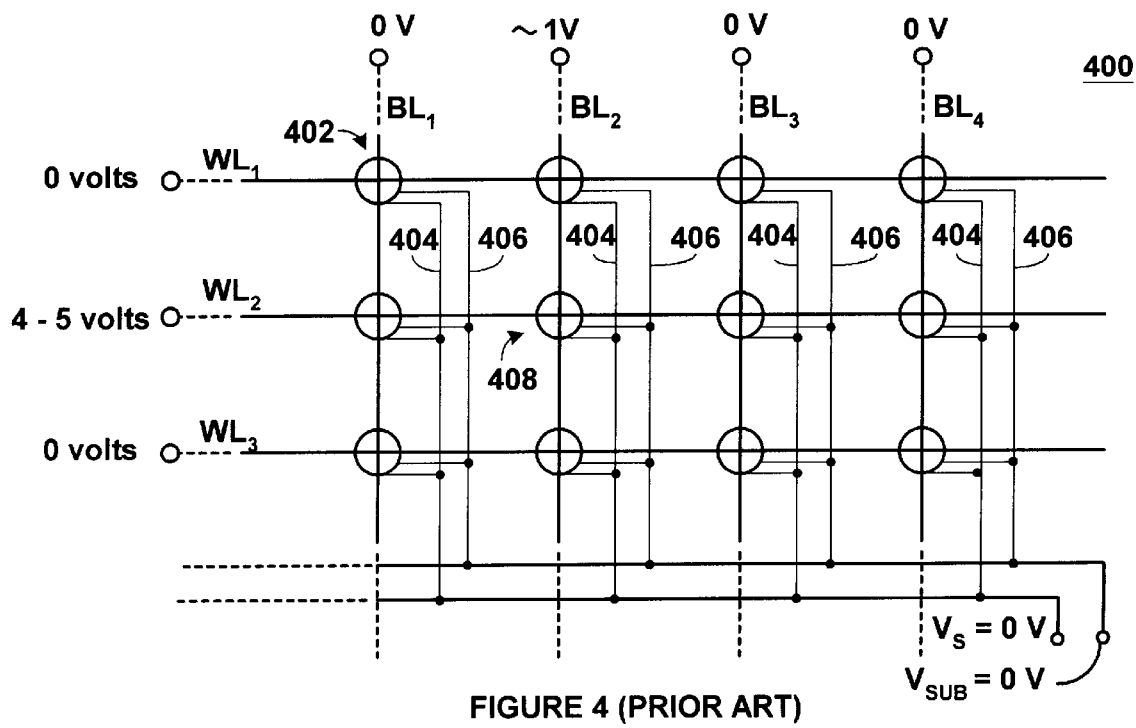
FIG. 4 is a simplified electrical schematic diagram of several flash EEPROM cells showing voltages applied to the terminals of all the flash memory cells in accordance with a prior art method.

FIG. 4 is a simplified electrical schematic diagram 400 of several flash EEPROM cells showing voltages being applied to the terminals of the several flash memory cells during a read operation in accordance with the prior art. Shown in FIG. 4 are three wordlines $WL_1$ through $WL_3$ and four bitlines $BL_1$ through $BL_4$. At the intersection of each wordline and each bitline is located a memory cell, such as the one indicated at 402. Lines 404 connect the source of each cell to common source terminal $V_s$. Lines 406 connect the substrate of each cell to a common substrate terminal $V_{substrate}$. During read all of the bitlines of the flash memory device are connected to ground except the bitline attached to the cell being read. For example, if the cell indicated at 408 is to be read, bitlines $BL_1$, $BL_3$ and $BL_4$ are connected to ground (0 volts) and $BL_2$ has a voltage of approximately 1 volt or less applied. In addition, in order to read cell 408 wordlines $WL_1$, and $WL_3$ are connected to ground and wordline $WL_2$ has a voltage of approximately 4 to 5 volts applied. The source and substrate terminals are grounded (0 volts).

Figure 5:
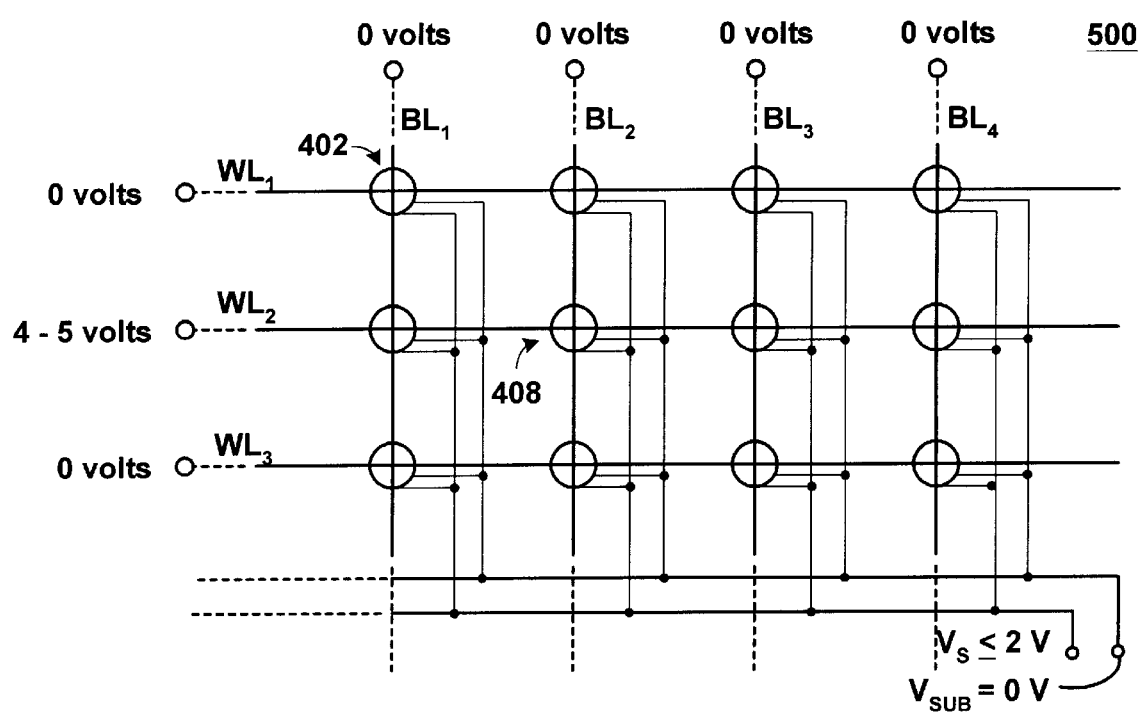
FIG. 5 is a simplified electrical schematic diagram of the flash EEPROM cells as shown in FIG. 4 showing voltages applied to the terminals of all the flash memory cells in accordance with the present invention.

FIG. 5 is a simplified electrical schematic diagram 500 of the several flash EEPROM cells as shown in FIG. 4 showing voltages being supplied to the terminals of the several flash memory cells during a read operation in accordance with the present invention. Shown in FIG. 5 are the three wordlines $WL_1$, through $WL_3$ and the four bitlines $BL_1$ through $B_4$. During read in accordance with the present invention, all bitlines are grounded (0 volts) including the bitline to which the bit being read (408) is attached. All wordlines are grounded (0 volts) except the wordline $WL_2$ to which the bit being read is attached has a voltage of between 4 to 5 volts applied. The common source terminal $V_s$ has a voltage of 2 volts or less applied. The common substrate terminal $V_{substrate}$ is grounded (0 volts).

In summary, the present invention overcomes the limitations of the prior art and fulfills the need for a method of reading a flash memory device that reduces the electric field in the source side tunnel oxide region of a flash memory device.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of reading a flash memory Electrically-Erasable Programmable Read-Only Memory (EEPROM) that reduces the electric field in the source side tunnel oxide region, wherein the EEPROM includes a multitude of field effect transistor memory cells each having a source, a drain, a floating gate, a control gate and a substrate, the method comprising:

(a) applying zero voltage to all bitlines in the flash memory device;

(b) applying a positive voltage to a wordline to which the cell being read is attached;

(c) applying a positive voltage to a common source terminal to which all the cells are attached;

(d) applying zero voltage to remaining wordlines; and (e) applying zero voltage to a common substrate terminal to which all the cells are attached.

2. The method of claim 1 wherein the voltage applied to the wordline to which the cell being read is attached is a voltage of approximately 4 to 5 volts.

3. The method of claim 2 wherein the voltage applied to the common source terminal is a voltage of less than or equal to 2 volts.

* * * * *